(12) United States Patent
Matsubara et al.

(10) Patent No.: US 11,190,805 B2
(45) Date of Patent: *Nov. 30, 2021

(54) DATA PROCESSING DEVICE AND DATA PROCESSING METHOD

(71) Applicant: RENESAS ELECTRONICS CORPORATION, Tokyo (JP)

(72) Inventors: Katsushige Matsubara, Tokyo (JP); Seiji Mochizuki, Tokyo (JP); Keisuke Matsumoto, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/834,616

(22) Filed: Mar. 30, 2020

(65) Prior Publication Data

US 2020/0228842 A1 Jul. 16, 2020

Related U.S. Application Data

(63) Continuation of application No. 16/126,739, filed on Sep. 10, 2018, now Pat. No. 10,645,420.

(30) Foreign Application Priority Data

Oct. 27, 2017 (JP) .............................. JP2017-208263

(51) Int. Cl.
*H04N 19/65* (2014.01)
*H04L 1/00* (2006.01)
(Continued)

(52) U.S. Cl.
CPC .............. *H04N 19/65* (2014.11); *H03M 7/30* (2013.01); *H03M 13/6312* (2013.01);
(Continued)

(58) Field of Classification Search
CPC ......... H04N 19/65; H04N 19/42; H03M 7/30; H03M 13/6312
See application file for complete search history.

(56) References Cited

U.S. PATENT DOCUMENTS

2009/0118017 A1* 5/2009 Perlman ............. H04N 21/6125
463/42
2012/0195513 A1* 8/2012 Suzuki ................. H04N 13/161
382/233

FOREIGN PATENT DOCUMENTS

| JP | 07-006100 A | 1/1995 |
|---|---|---|
| WO | 2009/073800 A1 | 6/2009 |
| WO | 2011/006538 A1 | 1/2011 |

OTHER PUBLICATIONS

U.S . . . PTO Non-Final Office issued in related parent U.S. Appl. No. 16/126,739, dated Sep. 16, 2019.
(Continued)

*Primary Examiner* — Tsion B Owens
(74) *Attorney, Agent, or Firm* — McDermott Will & Emery LLP

(57) ABSTRACT

Provided is a data processing device that reduces the amount of memory access in a case where data and an error control code are to be stored in a memory. The processing device includes a data compression section, a code generation section, a binding section, and a transfer section. The data compression section generates second data by performing a predetermined compression process on first data that is to be stored in a memory and of a predetermined data length. The code generation section generates an error control code for the first data or the second data. The binding section generates third data by binding the second data generated by the data compression section to the error control code generated by the code generation section. The transfer section transfers the third data generated by the binding (Continued)

section to the memory in units of the predetermined data length.

10 Claims, 13 Drawing Sheets

(51) Int. Cl.
    *H04N 19/503*     (2014.01)
    *H04N 19/159*     (2014.01)
    *H04N 19/176*     (2014.01)
    *H04N 19/42*     (2014.01)
    *H03M 7/30*     (2006.01)
    *H03M 13/00*     (2006.01)

(52) U.S. Cl.
    CPC ............ *H04L 1/007* (2013.01); *H04L 1/0041* (2013.01); *H04N 19/159* (2014.11); *H04N 19/176* (2014.11); *H04N 19/42* (2014.11); *H04N 19/503* (2014.11); *H04L 1/0057* (2013.01)

(56) References Cited

OTHER PUBLICATIONS

U.S. PTO Notice of Allowance issued in related parent U.S. Appl. No. 16/126,739, dated Jan. 24, 2020.
Extended European Search Report issued in corresponding European Patent Application No. 18196131.9-1208, dated Feb. 27, 2019.

\* cited by examiner

DATA PROCESSING DEVICE AND DATA PROCESSING METHOD

CROSS-REFERENCE TO RELATED APPLICATIONS

This is a Continuation of U.S. patent application Ser. No. 16/126,739 filed on Sep. 10, 2018, which claims the benefit of Japanese Patent Application No. 2017-208263 filed on Oct. 27, 2017 including the specification, drawings, and abstract are incorporated herein by reference in their entirety.

BACKGROUND

The present invention relates to a data processing device and a data processing method. For example, the present invention relates to a technology for storing error control codes in a memory.

Known are error detection codes or error correction codes, that is, a technology for detecting or correcting an error occurring in data. The error detection codes and the error correction codes are hereinafter generically referred to as error control codes. Data and an error control code for the data are stored in a memory so that the occurrence of an error can be checked for when the data stored in the memory is read.

A related technology is described in Japanese Unexamined Patent Application Publication No. Hei 7 (1995)-6100. A signal processing device disclosed in Japanese Unexamined Patent Application Publication No. Hei 7 (1995)-6100 efficiently uses an error control code generation section, a memory, and an error correction section. The error control code generation section generates a fixed-length error correction code from supplied fixed-length data and adds the fixed-length error correction code. The memory stores data having a data width expanded by the error correction section. The error correction section reads data stored in the memory and corrects any error in accordance with the error correction code.

SUMMARY

When data and an error control code for the data are to be stored in a memory, not only the data but also the error control code need to be transferred to the memory. This involves a greater amount of memory access than when only data is to be transferred. It is therefore demanded that the amount of memory access be reduced when the data and the error control code are to be stored in the memory.

Other problems and novel features will become apparent from the following description and from the accompanying drawings.

According to an aspect of the present invention, there is provided a data processing device including a binding section and a transfer section. The binding section generates data that is obtained by binding data generated by a data compression section to an error control code generated by a code generation section. The transfer section transfers the bound data to a memory in units of a predetermined data length.

The above aspect of the present invention reduces the amount of memory access in a case where data and an error control code are to be stored in a memory.

DETAILED DESCRIPTION

Figure 1:
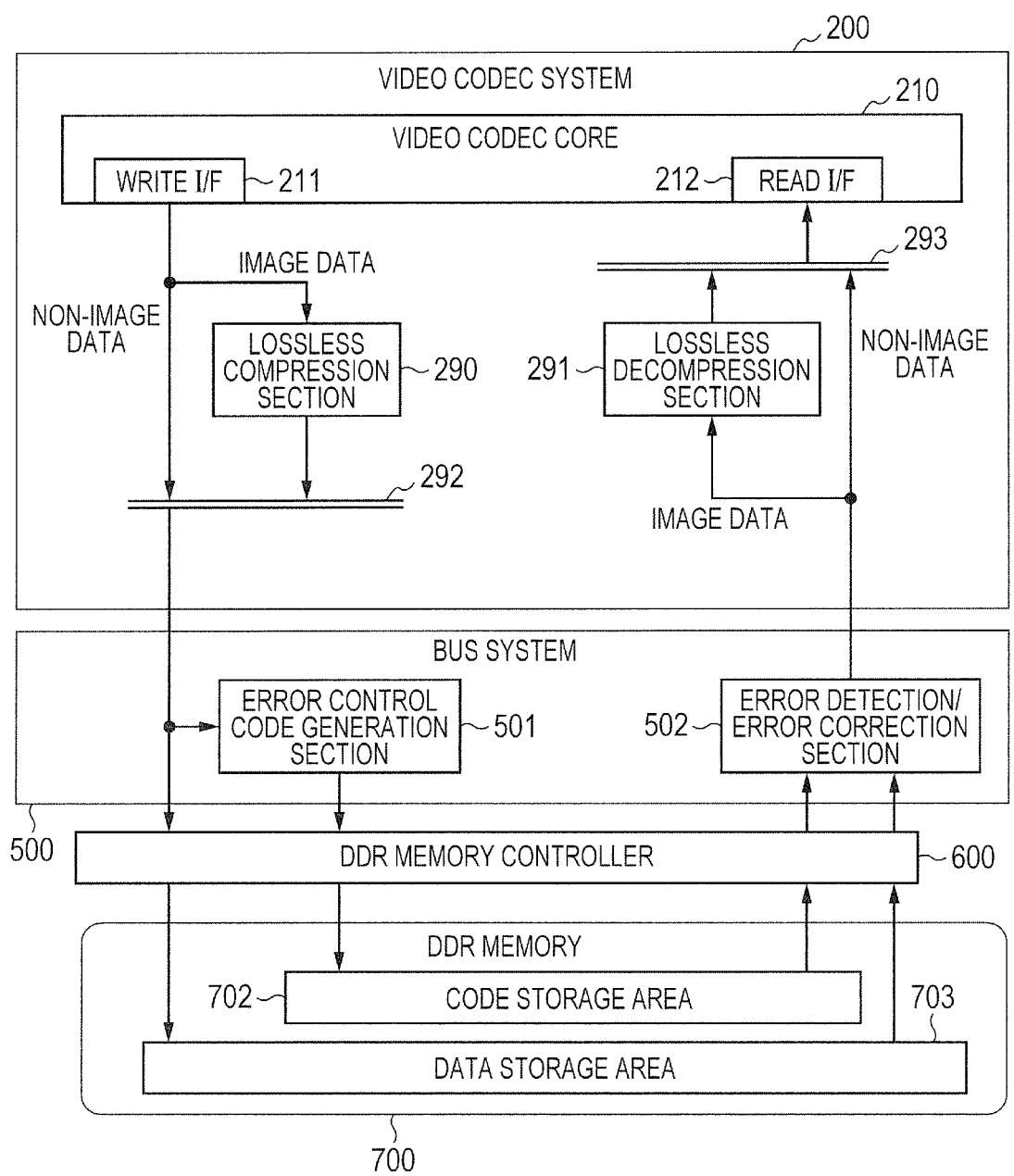
FIG. 1 is a block diagram illustrating a configuration of a data processing device according to a comparative example.

In the following description and in the drawings, omissions and simplifications are made as needed for the clarification of explanation. Further, like elements in the drawings are designated by like reference numerals and will not be redundantly described.

Preliminary Studies

Before the explanation of embodiments, preliminary studies conducted by the inventors of the present invention will be described.

FIG. 1 is a block diagram illustrating a configuration of a data processing device 9 according to a comparative example. The data processing device 9 includes a video codec system 200, a bus system 500, a DDR (double data rate) memory 700, and a DDR memory controller 600. The data processing device 9 performs a video codec process.

When performing a codec process, the video codec system 200 stores data in the DDR memory 700, which is an external memory. Further, when performing a codec process, the video codec system 200 reads data stored in the DDR memory 700. Access to the DDR memory 700 is controlled by the DDR memory controller 600.

An error may occur in the data stored in the DDR memory 700, that is, the data is corrupted. Therefore, the data processing device 9 according to the comparative example is configured so that the bus system 500 includes an error control code generation section 501 and an error detection/error correction section 502 as an error control code processing mechanism in order to detect or correct the error.

The error control code generation section 501 generates an error control code from write data and stores the error control code in an area other than a write data storage area. More specifically, the write data is stored in a data storage area 703 of the DDR memory 700, and the error control code generated by the error control code generation section 501 is stored in a code storage area 702 of the DDR memory 700. When data stored in the data storage area 703 is to be read, an error control code for the data is read from the code storage area 702, and the error detection/error correction section 502 detects or corrects an error. It should be noted that the data processing device 9 according to the comparative example uses a Hamming code as the error control code. The length of the code is 1 byte for 8-byte data.

The codec process uses two types of memory accesses, namely, the transfer of image data and the transfer of other data (or more specifically, a bitstream or other sequence of bits). The amount of image data transfer accounts for approximately 85% of the total amount of transfer in the codec process. In order to reduce memory bandwidth to be consumed for transfer, therefore, the data processing device 9 according to the comparative example applies lossless compression to image data. That is to say, the video codec system 200 includes a lossless compression section 290 and a lossless decompression section 291.

The lossless compression section 290 performs lossless compression on image data that is outputted from a write interface (write I/F) 211 of a video codec core 210 in the video codec system 200. It should be noted that the video codec core 210 is an element that performs an encoding process or a decoding process.

As illustrated in FIG. 1, image data compressed by the lossless compression section 290 and non-image data (e.g., a bitstream) are inputted to the error control code generation section 501 through a selector 292. Therefore, the error control code generation section 501 generates an error control code for both the image data compressed by the lossless compression section 290 and non-image data. The compressed image data and non-image data are then stored in the data storage area 703, and the generated error control code is stored in the code storage area 702. As described above, the data processing device 9 according to the comparative example generates an error control code without discriminating the two types of data outputted from the video codec core and stores the generated error control code in the DDR memory 700.

Meanwhile, the lossless decompression section 291 restores image data by performing a decompression process on compressed image data outputted from the error detection/error correction section 502. Then, as illustrated in FIG. 1, non-image data outputted from the error detection/error correction section 502 and the image data outputted from the lossless decompression section 291 are inputted to a read interface (read I/F) 212 of the video codec core 210 through a selector 293 and used for processing by the video codec core 210.

When the access efficiency of the DDR memory 700 is taken into consideration, it is desirable that accessing to consecutive addresses have a certain length per access. The reason is that if the data length per access is excessively small, processing contingent to access processing (e.g., processing for memory bank switching) cannot easily be executed in parallel with access processing. This degrades the access efficiency. However, from the viewpoint of image data access of video codec process, if excessively long data is accessed at a time, unnecessary data is read to increase the total amount of memory bandwidth. Consequently, there is an optimal data length per access in the DDR memory 700. In video codec processing, for example, an optimal length of data handled by a single access is 256 bytes in consideration of the access efficiency of the DDR memory 700 and the total amount of memory bandwidth. That is to say, the write I/F 211 outputs 256-byte data at a time.

The minimum access unit is defined for the DDR memory 700. If the DDR memory 700 is, for example, an LPDDR4 (low-power DDR4) having a 32-bit interface, the minimum access unit is 64 bytes (32 bits×16 bursts). This signifies that the amount of transfer is always in units of 64 bytes even if accessing involves data less than 64 bytes. Meanwhile, the length of an error control code for 256-byte data is 32 bytes. Thus, image data to which lossless compression is applied may be less than 256 bytes in transfer data length. However, an error control code for the image data is always subjected to a 64-byte transfer.

As described above, the codec process uses two types of memory accesses, namely, the transfer of image data and the transfer of other data (bitstream). The image data is often accessed in random order in units of a rectangular area such as 13×13 pixels or 9×9 pixels. Meanwhile, the other data is often accessed in address order.

Consequently, a cache memory may be used so that an error control code for non-image data once read from the DDR memory 700 can be reused. More specifically, the following reuse is possible. An error control code (code C1) for read-targeted data (data D1), that is, data to be read, and an error control code (code C2) for data to be not read (data D2) are read within a single read of an error control code, and the two error control codes (codes C1 and C2) are stored in the cache memory. If, subsequently, data D2 becomes read-targeted data needs to be accessed for read, code C2 need not be read from the DDR memory 700, but can be read from the cache memory.

However, image data are accessed in random order. Therefore, even when a 64-byte error control code (that is, two (=64 bytes/32 bytes) error control codes) is stored, for example, in a cache memory, the error control code is expelled from the cache memory before it is reused. Thus, the probability of reuse is low. In the worst case, therefore, a 64-byte error control code is transferred upon each data access (256 bytes or less).

The amount of transfer in the data processing device 9 according to the comparative example will now be studied. When the amount of transfer in a case where no compression is performed and no error control code is added is 100%, Equation (1) below expresses a relative value V of the amount of transfer in a case where compression is performed and an error control code is added. It should be noted that R in Equation (1) represents an average lossless compression ratio. R is a value within the range of 0 to 1. An R value of 1 indicates that data is not to be compressed at all. Further, Equation (1) assumes that the percentage of image data to be transferred to the DDR memory 700 is 85%, and that the percentage of the other data to be transferred to the DDR memory 700 is 15%. Furthermore, the transfer of the non-image data is performed in address order. Therefore, it is also assumed that a cache memory is used to permit the reuse of an error control code. That is to say, it is assumed that an error control code for non-image data is substantially subjected to 32-byte transfer.

$$\text{Relative value } V=(85\% \times (256 \times R+64)+15\% \times (256+32))/(85\% \times 256+15\% \times 256) \quad (1)$$

The table below illustrates the relative value V of the amount of transfer in a case where the value R is changed from 0.1 to 1.0 in increments of 0.1.

TABLE 1

| Compression ratio R | 0.1 | 0.2 | 0.3 | 0.4 | 0.5 | 0.6 | 0.7 | 0.8 | 0.9 | 1.0 |
|---|---|---|---|---|---|---|---|---|---|---|
| Relative value V | 47% | 55% | 64% | 72% | 81% | 89% | 98% | 106% | 115% | 123% |

Table 1 provides the following findings. Even if lossless compression reduces the amount of image data by 30%, adding an error control code results in a relative value V of 98%. It signifies that a required transfer bandwidth is substantially equal to a transfer bandwidth required before compression. Further, even if lossless compression reduces the amount of image data by 50%, adding an error control code results in an overall data amount reduction of approximately 20%. Furthermore, if lossless compression reduces the amount of image data by a percentage lower than 30%, an unused transfer bandwidth is greater than a transfer bandwidth unused before compression. If, for example, reduction achieved by lossless compression is 0, the transfer bandwidth is increased by 23%.

As described above, even if lossless compression is applied to reduce the transfer bandwidth, adding an error control code increases the transfer bandwidth. This negates the effects of bandwidth reduction by lossless compression. Consequently, it is expected that the amount of memory access will be reduced when data and the error control code are to be stored in a memory.

Overview of Embodiments

Embodiments of the present invention will now be outlined.

Figure 2:
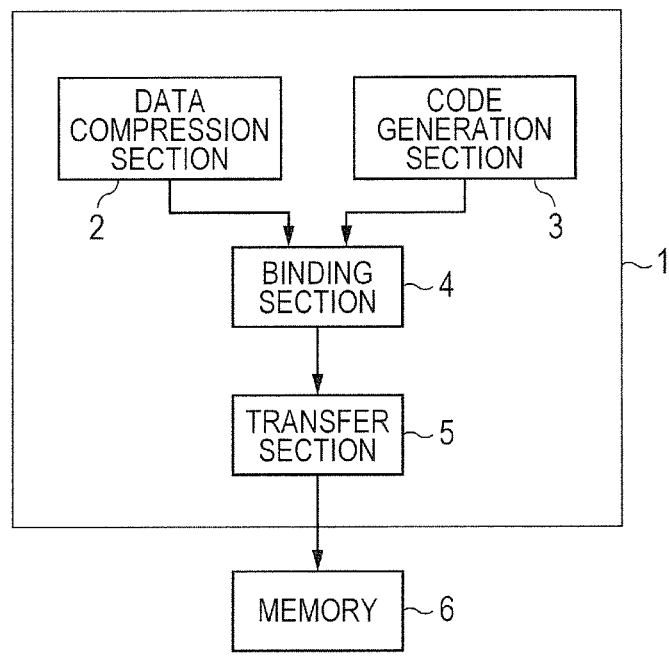
FIG. 2 is a block diagram illustrating an exemplary configuration of a data processing device according to the overview of embodiments of the present invention.

FIG. 2 is a block diagram illustrating an exemplary configuration of a data processing device 1 according to the overview of embodiments. As illustrated in FIG. 2, the data processing device 1 includes a data compression section 2, a code generation section 3, a binding section 4, and a transfer section 5, and accesses an external memory 6. In the example of FIG. 2, the memory 6 is disposed external to the data processing device 1. However, the data processing device 1 may alternatively include the memory 6. For example, the memory 6 is a DDR memory. However, the memory 6 is not limited to a DDR memory.

The data compression section 2 generates second data by performing a predetermined compression process on first data that has a predetermined data length and is to be stored in the memory 6. The first data is, for example, image data. However, the first data is not limited to image data and may be any type of data. Further, the predetermined compression process is, for example, a lossless compression process. However, the predetermined compression process is not limited to a lossless compression process and may be any compression process.

The code generation section 3 generates an error control code for the first data or the second data (data obtained by compressing the first data). The code generation section 3 generates a predetermined error control code.

The binding section 4 generates third data by binding the second data generated by the data compression section 2 to the error control code generated by the code generation section 3.

The transfer section 5 transfers the third data generated by the binding section 4 to the memory 6 in units of the predetermined data length. Thus, the second data and the error control code can be stored in the memory 6 by gaining access in units of the predetermined data length. Therefore, even at the time of reading, the second data and the error control code can be acquired from the memory 6 by gaining access in units of the predetermined data length.

Figure 3:
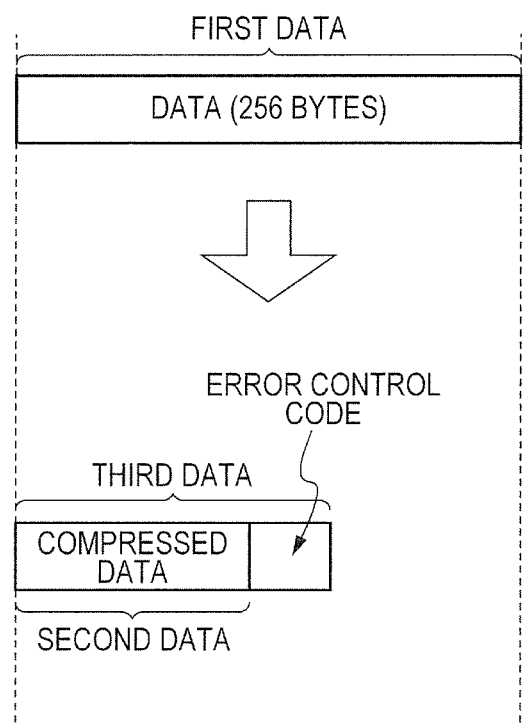
FIG. 3 is a schematic diagram illustrating how a binding section performs a binding operation.

FIG. 3 is a schematic diagram illustrating how the binding section 4 performs a binding operation. Here, it assumed that the predetermined data length is 256 bytes. That is to say, it is assumed that the first data is 256-byte data. The first data is compressed by the data compression section 2 to obtain the second data having a data length of 256 bytes or less. Therefore, when the memory 6 is to be accessed in units of 256 bytes, a gap may arise in a band as depicted in FIG. 3. The binding operation of the binding section 4 makes it possible to use the gap in order to transfer the error control code simultaneously with the compressed data (second data). This suppresses an increase in the amount of memory access gained to transfer the error control code.

First Embodiment

Figure 4:
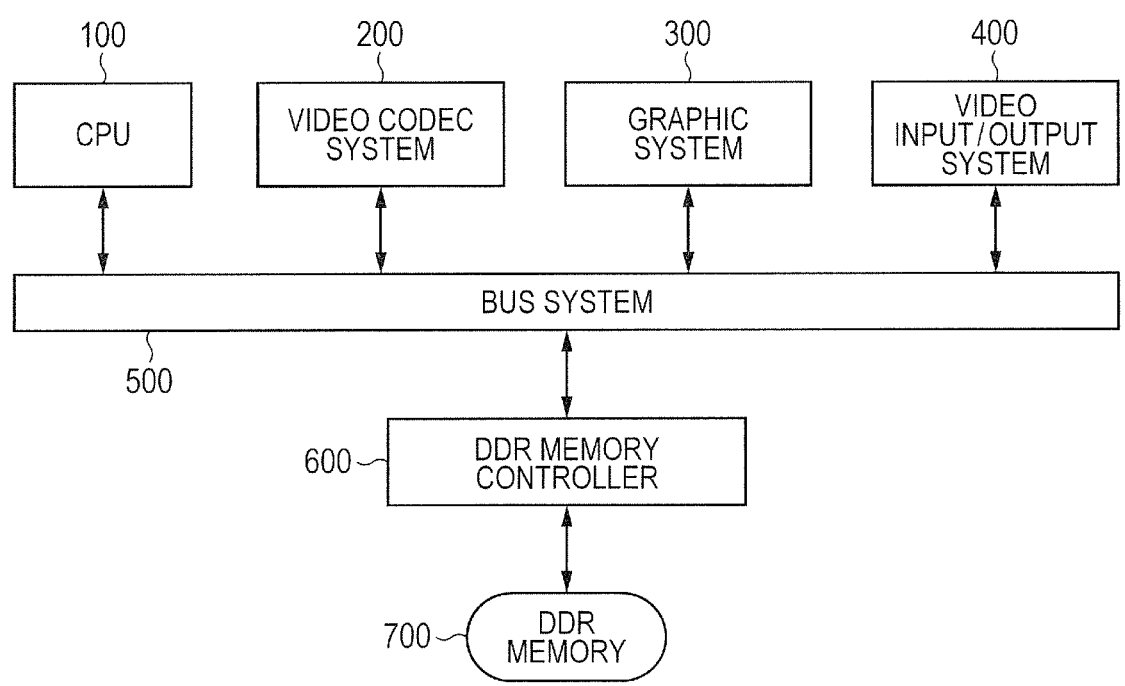
FIG. 4 is a block diagram illustrating an exemplary configuration of the data processing device according to a first embodiment of the present invention.

A first embodiment of the present invention will now be described. FIG. 4 is a block diagram illustrating an exemplary configuration of a data processing device 10 according to the first embodiment. The data processing device 10 includes a CPU (central processing unit) 100, a video codec system 200, a graphic system 300, a video input/output system 400, a bus system. 500, a DDR memory controller 600, and a DDR memory 700. In the example of FIG. 4, the data processing device includes subsystems such as the video codec system 200, the graphic system 300, and the video input/output system 400, but may additionally include some other subsystems as needed.

The CPU 100, the video codec system 200, the graphic system 300, the video input/output system 400, and the DDR memory controller 600 are each coupled to the bus system 500 and are capable of communicating with each other.

The CPU 100 provides overall control of the data processing device 10. The CPU 100 controls the data processing device 10 by executing, for example, a program (application software) stored in the DDR memory 700. The video codec system 200 performs a codec process on video, and will be described in detail later. The graphic system 300 generates two-dimensional or three-dimensional graphics. The video input/output system 400 performs a process of acquiring video from a camera (not depicted) coupled to the data processing device 10 or performs a process of displaying video on a display (not depicted) coupled to the data processing device 10.

The bus system 500 controls a process of transfer between the CPU 100, the video codec system 200, the graphic system 300, the video input/output system 400, and the DDR memory controller 600. The DDR memory controller 600 controls access to the DDR memory 700. The DDR memory 700 stores, for example, programs and data used by the CPU 100, data used by the subsystems, and data shared by the CPU and the subsystems. Processes of the subsystems, bus system 500, and DDR memory controller 600 are implemented by their respective hardware circuits. However, such processes may alternatively be implemented by allowing processors to execute programs.

Figure 5:
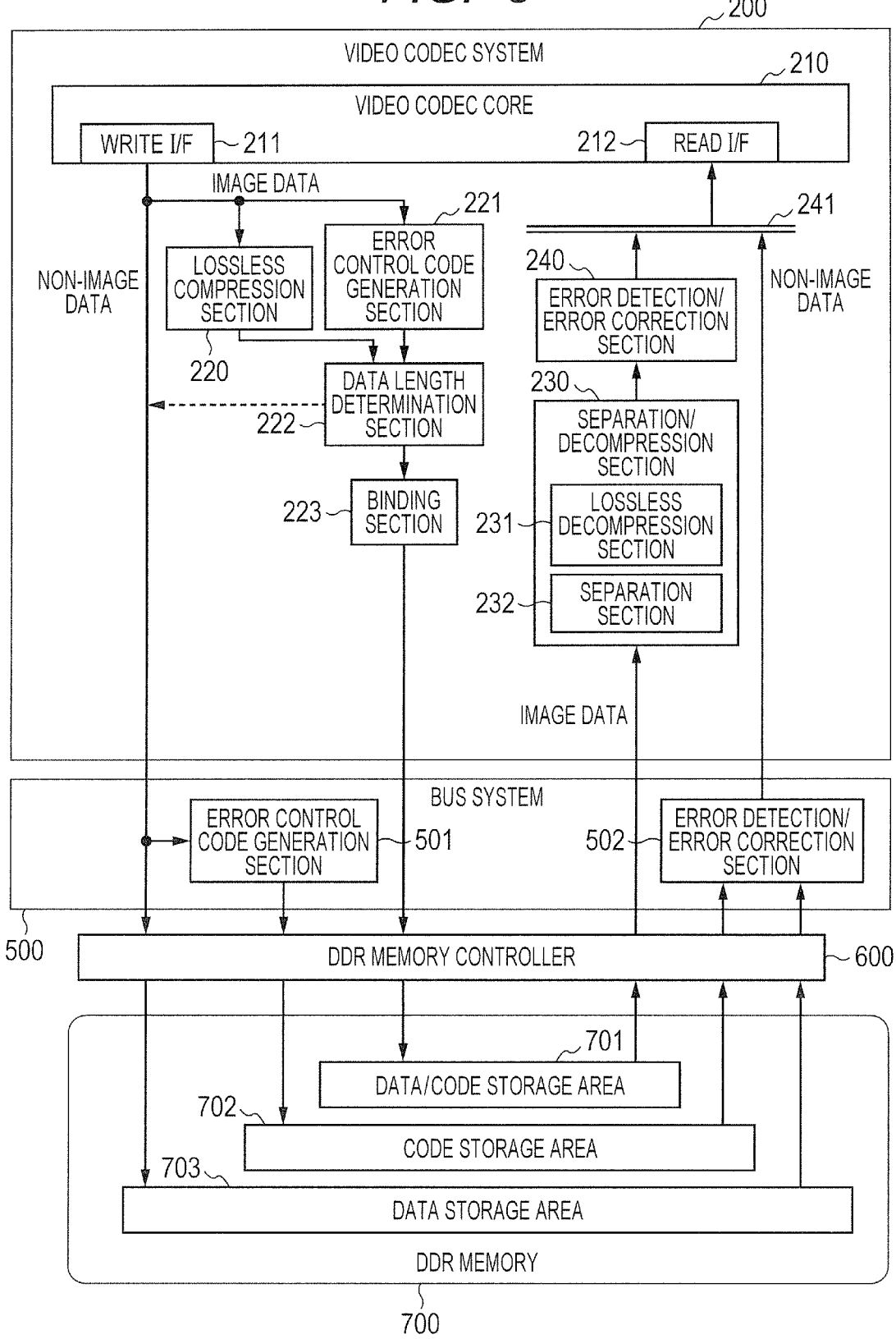
FIG. 5 is a block diagram illustrating a more detailed configuration of the data processing device according to the first embodiment of the present invention with particular attention paid to a video codec system.

Configuration and operation will now be described with particular attention paid to the video codec system 200 in order to explain about the reduction of a memory access amount in the data processing device 10. FIG. 5 is a block diagram illustrating a more detailed configuration of the data processing device 10 with particular attention paid to a video codec system 200. Operation of the video codec system 200 is controlled when, for example, a program for controlling the codec process is executed by the CPU 100. The configuration of the data processing device 10 is described below with reference to FIG. 5.

In addition to the video codec core 210, the video codec system 200 includes elements for performing a write-related process and elements for performing a read-related process. The elements for performing a write-related process include a lossless compression section 220, an error control code generation section 221, a data length determination section 222, and a binding section 223. The elements for performing a read-related process include a separation/decompression section 230 and an error detection/error correction section 240.

The video codec core 210 is an element that performs a video encoding process or a video decoding process. When performing a process, the video codec core 210 writes data into the DDR memory 700 through the write I/F 211 and reads data from the DDR memory 700 through the read I/F 212. When writing data into the DDR memory 700, the video codec core 210 outputs storage-targeted data from the write I/F 211 in units of a predetermined data length (or more specifically, in units of 256 bytes). The write I/F 211 of the video codec core 210 outputs image data or non-image data. Here, the image data is data in which the pixel value of each pixel is indicated. More specifically, the image data is, for example, RGB data and YUV data. Meanwhile, non-image data is, for example, a bitstream generated by codec processing.

Image data in units of the predetermined data length (256 bytes), which is outputted from the write I/F 211, is inputted to the lossless compression section 220 and the error control code generation section 221. The lossless compression section 220 corresponds to the data compression section 2 depicted in FIG. 2, and performs a predetermined lossless compression process on image data having the predetermined data length (256 bytes). That is to say, the lossless compression section 220 performs a compression process in units of 256 bytes. It should be noted that the lossless compression section 220 performs, for example, an entropy coding process. However, the lossless compression section 220 may perform an alternative lossless compression process.

The error control code generation section 221 corresponds to the code generation section 3 depicted in FIG. 2, and generates a predetermined error control code for image data having a predetermined data length (256 bytes). That is to say, the error control code generation section 221 calculates an error control code for 256-byte image data that is still not losslessly compressed. It should be noted that the error control code generation section 221 generates, for example, a CRC (cyclic redundancy check) code as an error control code. However, the error control code generation section 221 may generate an alternative error control code.

The data length determination section 222 determines whether the sum of the data length of data compressed by the lossless compression section 220 and the code length of an error control code generated by the error control code generation section 221 is equal to or smaller than the predetermined data length (256 bytes). The data length of data compressed by the lossless compression section 220 is not fixed, but is variable with the type of compression-targeted data.

The binding section 223 corresponds to the binding section 4 depicted in FIG. 2. If the sum is equal to or smaller than the predetermined data length (256 bytes), the binding section 223 generates data that is obtained by binding the compressed data generated by the lossless compression section 220 to the error control code generated by the error control code generation section 221, and outputs the generated data to the bus system 500. More specifically, the binding section 223 joins an error control code, for example, to the end of compressed data in order to generate single data that is a combination of the compressed data and the error control code. The data outputted from the binding section 223 is stored in a data/code storage area 701 of the DDR memory 700 by the bus system 500. The data/code storage area 701 is a memory area for storing data that is a combination of compressed data and an error control code.

The bus system 500 corresponds to the transfer section 5 depicted in FIG. 2, and transfers data generated by the binding section 223 to the DDR memory 700 in units of the predetermined data length (256 bytes). If the sum is smaller than 256 bytes, 256-byte data including the data generated by the binding section 223 and arbitrary data is transferred.

If the data length determination section 222 determines that the sum is greater than the predetermined data length (256 bytes), the binding section 223 does not perform the binding operation. In this case, the bus system 500 stores both image data outputted from the write I/F 211 and an error control code for the image data in the DDR memory 700. More specifically, if the data length determination section 222 determines that the sum is greater than 256 bytes, the configuration depicted in FIG. 5 stores image data outputted from the write I/F 211 (image data still not losslessly compressed) in the data storage area 703 of the DDR memory 700, and stores an error control code generated for the image data by the error control code generation section 501 of the bus system 500 in the code storage area 702. The data storage area 703 is a memory area for storing data. The code storage area 702 is a memory area for storing an error control code. As described above, even when the total data length is greater than the predetermined data length, the present embodiment properly stores data and an error control code in the DDR memory 700.

The bus system 500 includes the error control code generation section 501 and the error detection/error correction section 502. The error control code generation section 501 generates a predetermined error control code for non-image data that is outputted from the write I/F 211. Further, if the data length determination section 222 determines that the sum is greater than the predetermined data length, the error control code generation section 501 generates a predetermined error control code for image data outputted from the write I/F 211. The error control code generation section 501 may generate the same type of error control code as the error control code generation section 221 or generate a different type of error control code.

The bus system 500 stores an error control code generated by the error control code generation section 501 in the code storage area 702 of the DDR memory 700. Further, the bus system 500 stores data related to the error control code generated by the error control code generation section 501 in the data storage area 703.

When the DDR memory 700 is accessed to read data in the data/code storage area 701, the bus system 500 outputs data obtained by binding compressed data to an error control code to the separation/decompression section 230 of the video codec system 200. When, by contrast, the DDR memory 700 is accessed to read data in the data storage area 703, the bus system 500 reads data in the data storage area 703 and an error control code for the data, which is stored in the code storage area 702, and allows the error detection/error correction section 502 to process the read data and error control code.

The error detection/error correction section 502 generates a predetermined error control code (the same type of error control code as the one generated by the error control code generation section 501) for data read from the data storage area 703, and detects or corrects an error in the data by using the error control code read from the code storage area 702. When an error is corrected, the error detection/error correction section 502 outputs the error-corrected data to the read I/F 212 of the video codec core 210 through a selector 241. Under other circumstances, the error detection/error correction section 502 outputs data read from the data storage area 703 to the read I/F 212 through the selector 241.

The separation/decompression section 230 of the video codec system 200 includes a lossless decompression section 231 and a separation section 232, and performs a process of separating an error control code and decompressing data in accordance with data obtained by binding compressed data to an error control code. The lossless decompression section 231 performs a decompression process for a predetermined compression process performed in the lossless compression section 220 by using bound data acquired from the data/code storage area 701 of the DDR memory 700. The lossless decompression section 231 is referred to also as the data decompression section.

The separation section 232 extracts an error control code included in the bound data. For example, the separation/decompression section 230 separates an error control code as described below. However, the separation may be achieved by an alternative method. For example, the separation/decompression section 230 starts a lossless decompression process from the beginning of data read from the data/code storage area 701. When data having a predetermined data length (256 bytes) is obtained, the separation/decompression section 230 terminates the decompression process. The separation/decompression section 230 then extracts, as an error control code, a data portion not targeted for lossless decompression from the data read from the data/code storage area 701.

The separation/decompression section 230 outputs data obtained from the decompression process and the separated error control code to the error detection/error correction section 240.

The error detection/error correction section 240 detects or corrects an error by using an error control code included in the bound data acquired from the DDR memory 700. The error detection/error correction section 240 is referred to also as the detection section. More specifically, the error detection/error correction section 240 generates a predetermined error correction code (the same type of error control code as the one generated by the error control code generation section 221) for data (256-byte image data) obtained from the decompression process, and detects or corrects an error in the data by using the separated error control code. When an error is corrected, the error detection/error correction section 240 outputs the error-corrected data to the read I/F 212 through the selector 241. Under other circumstances, the error detection/error correction section 240 outputs data outputted from the separation/decompression section 230 to the read I/F 212 through the selector 241.

As the above-described process is performed by the separation/decompression section 230, the bound data stored in the data/code storage area 701 can be properly read.

Data write and data read operations in the data processing device 10 will now be described. Here, in particular, image data write and image data read operations are described below with reference to a flowchart.

Figure 6:
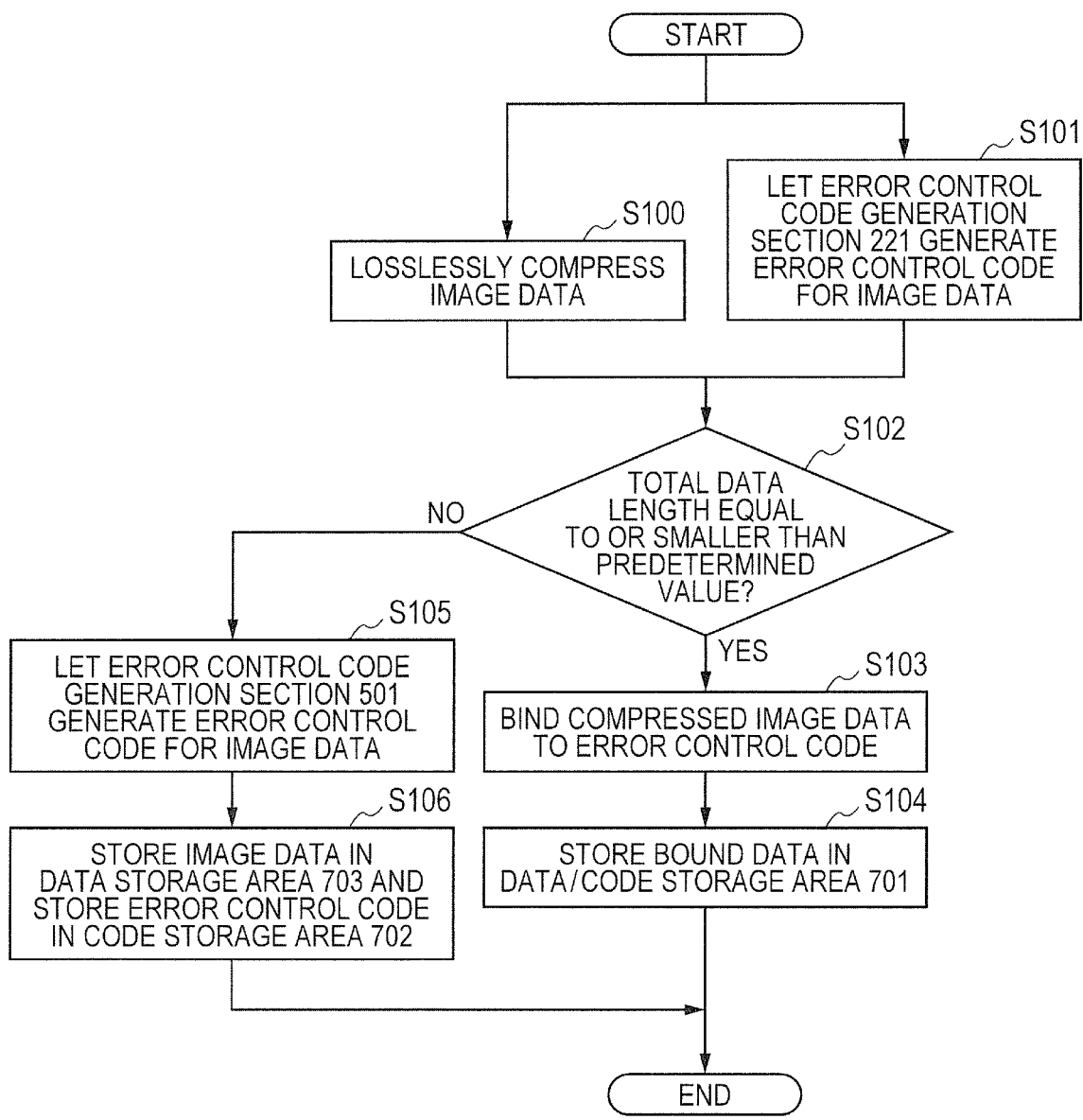
FIG. 6 is a flowchart illustrating exemplary operations that are performed by the data processing device according to the first embodiment in order to write image data outputted from a video codec core into a DDR memory.

FIG. 6 is a flowchart illustrating exemplary operations that are performed by the data processing device 10 according to the first embodiment in order to write image data outputted from the video codec core 210 into the DDR memory 700. Image data write operations will now be described with reference to FIG. 6.

When image data is outputted from the write I/F 211 of the video codec core 210, processing is performed as described in steps 100 and 101. Steps 100 and 101 may be performed in parallel or in sequence.

In step 100 (S100), the lossless compression section 220 losslessly compresses image data having a predetermined data length (256 bytes).

In step 101 (S101), the error control code generation section 221 generates an error control code for the image data having the predetermined data length (256 bytes).

Next, in step 102 (S102), the data length determination section 222 determines whether the sum of the data length of the data generated in step 100 and the code length of the error control code generated in step 101 is equal to or smaller than a predetermined value. The predetermined value is the same as the aforementioned predetermined data length (256 bytes). If the sum is equal to or smaller than the predetermined value, processing proceeds to step 103. If, by contrast, the sum is greater than the predetermined value, processing proceeds to step 105.

In step 103 (S103), the binding section 223 obtains single data by binding the image data compressed in step 100 to the error control code generated in step 101.

Upon completion of step 103, processing proceeds to step 104 (S104). In step 104, the bus system 500 transfers the data bound in step 103 to the DDR memory 700 in units of the predetermined data length (256 bytes), and stores the transferred data in the data/code storage area 701.

Meanwhile, in step 105 (S105), the error control code generation section 501 generates an error control code for image data having the predetermined data length (256 bytes), which is outputted from the write I/F 211.

Upon completion of step 105, processing proceeds to step 106 (S106). In step 106, the bus system 500 stores the image data outputted from the write I/F 211 in the data storage area 703, and stores the error control code generated in step 105 in the code storage area 702.

If the sum is greater than the predetermined value, the present embodiment stores uncompressed data in the DDR memory 700. Alternatively, however, compressed data may be stored in the DDR memory 700.

Figure 7:
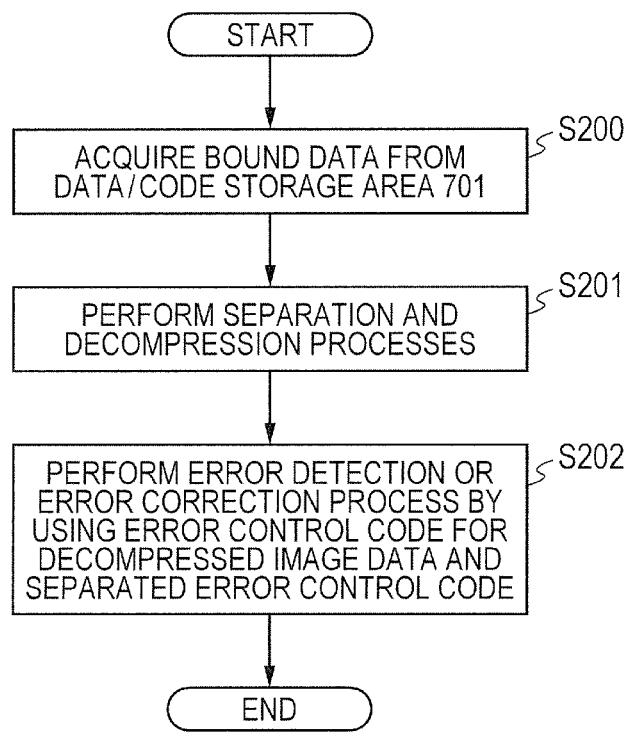
FIG. 7 is a flowchart illustrating exemplary operations that are performed by the data processing device according to the first embodiment in order to read data stored in a data/code storage area.

Operations performed to read data (bound data) stored in the data/code storage area 701 will now be described. FIG. 7 is a flowchart illustrating exemplary operations that are performed by the data processing device 10 according to the first embodiment in order to read data stored in the data/code storage area 701.

First of all, in step 200 (S200), the bus system 500 acquires data obtained by binding compressed data to an error control code from the data/code storage area 701.

Next, in step 201 (S201), the separation/decompression section 230 performs a process of separating the error control code and decompressing the data in accordance with the bound data acquired in step 200.

Then, in step 202 (S202), the error detection/error correction section 240 performs an error detection or error correction process by using an error control code calculated from the decompressed image data and the separated error control code. The error detection/error correction section 240 then outputs the decompressed data or corrected decompressed data to the read I/F 212 of the video codec core 210.

A more detailed example will now be described.

Figure 8:
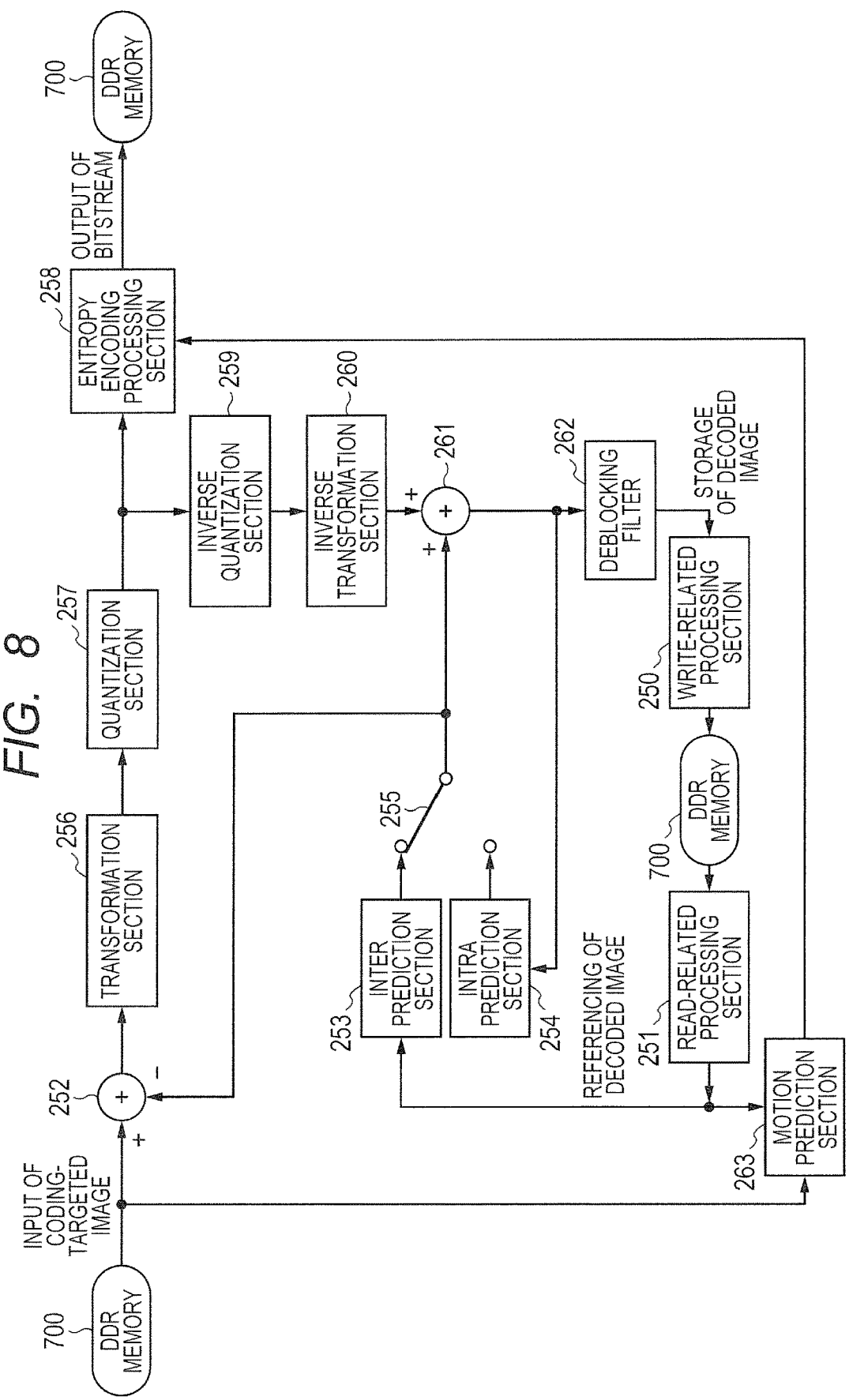
FIG. 8 is a block diagram illustrating an exemplary configuration of the video codec system in a case where the first embodiment is applied to a video encoding process.

FIG. 8 is a block diagram illustrating an exemplary configuration of the video codec system 200 in a case where the first embodiment is applied to a video encoding process. In FIG. 8, the lossless compression section 220, the error control code generation section 221, the data length determination section 222, and the binding section 223, which are depicted in FIG. 5, are collectively depicted as a write-related processing section 250. Further, the separation/decompression section 230 and the error detection/error correction section 240, which are depicted in FIG. 5, are collectively depicted as a read-related processing section 251. In FIG. 8, elements other than the write-related processing section 250, the read-related processing section 251, and the DDE memory 700 belong to the video codec core 210 depicted in FIG. 5.

A coding-targeted image read from the DDR memory 700 is inputted to a subtractor 252 in order to calculate its difference from a predicted image generated by an inter prediction section 253, which provides inter prediction, or from a predicted image generated by an intra prediction section 254, which provides intra prediction. Among data that is from the inter prediction section 253, and from the intra prediction section 254, data selected by a selection section 255 is inputted to the subtractor 252. The selection section 255 selects, for example, data that provides increased coding efficiency.

Difference data outputted from the subtractor 252 is inputted to a transformation section 256. The transformation section 256 subjects the difference data to orthogonal transformation (discrete cosine transform). A quantization section 257 quantizes the data transformed by the transformation section 256, and outputs the quantized data to an entropy encoding processing section 258 and an inverse quantization section 259. The inverse quantization section 259 inversely quantizes data quantized by the quantization section 257. An inverse transformation section 260 inversely orthogonally transforms the data inversely quantized by the inverse quantization section 259. An adder 261 adds the output of the inverse transformation section 260 to the predicted image selected by the selection section 255. Data outputted from the adder 261 is used for prediction by the intra prediction section 254. A deblocking filter 262 performs a filtering process of reducing block distortion of image data outputted from the adder 261.

Image data outputted from the deblocking filter 262 is stored in the DDR memory 700 as a local decoded image. That is to say, the local decoded image is outputted from the write I/F 211 depicted in FIG. 5, and inputted to the write-related processing section 250. In the write-related processing section 250, processing is performed by the aforementioned lossless compression section 220, error control code generation section 221, data length determination section 222, and binding section 223. Thus, the image data and its error control code are stored in the DDR memory 700.

The image data stored in the DDR memory 700 as described above is to be read for reference during processing by the inter prediction section 253 or processing by a motion prediction section 263. In such an instance, the image data is read through the read-related processing section 251. That is to say, the image data is processed by the aforementioned separation/decompression section 230 and error detection/error correction section 240, and then inputted to the read I/F 212.

The motion prediction section 263 performs a motion prediction process by using a coding-targeted image and an image read from the DDR memory 700. Data obtained as the result of processing by the motion prediction section 263 is outputted to the entropy encoding processing section 258. The entropy encoding processing section 258 performs an entropy coding process, for example, on data from the quantization section 257 and data from the motion prediction section 263, and outputs the result of the process as a bitstream. The bitstream outputted from the entropy encoding processing section 258 is outputted from the write I/F 211 depicted in FIG. 5 and written into the DDR memory 700 as non-image data. That is to say, an error control code is generated by the error control code generation section 501, and the generated error control code and bitstream data are both stored in the DDR memory 700.

As described above, the data processing device 10 can be applied to video codec processing. Particularly, the data processing device 10 includes the video codec core 210 (referred to also as the codec section), which performs a predetermined video codec process of generating a bitstream from a coding-targeted image. The data inputted to the write-related processing section 250 is image data that is used to generate a predicted image in the predetermined video codec process. The above-described configuration reduces the amount of memory access when the predicted image is generated in the video codec process.

Further, the data processing device 10 includes the error control code generation section 501, which generates an error control code for a bitstream, and the bus system 500 transfers both the bitstream and the error control code generated by the error control code generation section 501 to the DDR memory 700. Therefore, error detection or correction for the bitstream can also be achieved.

Figure 9:
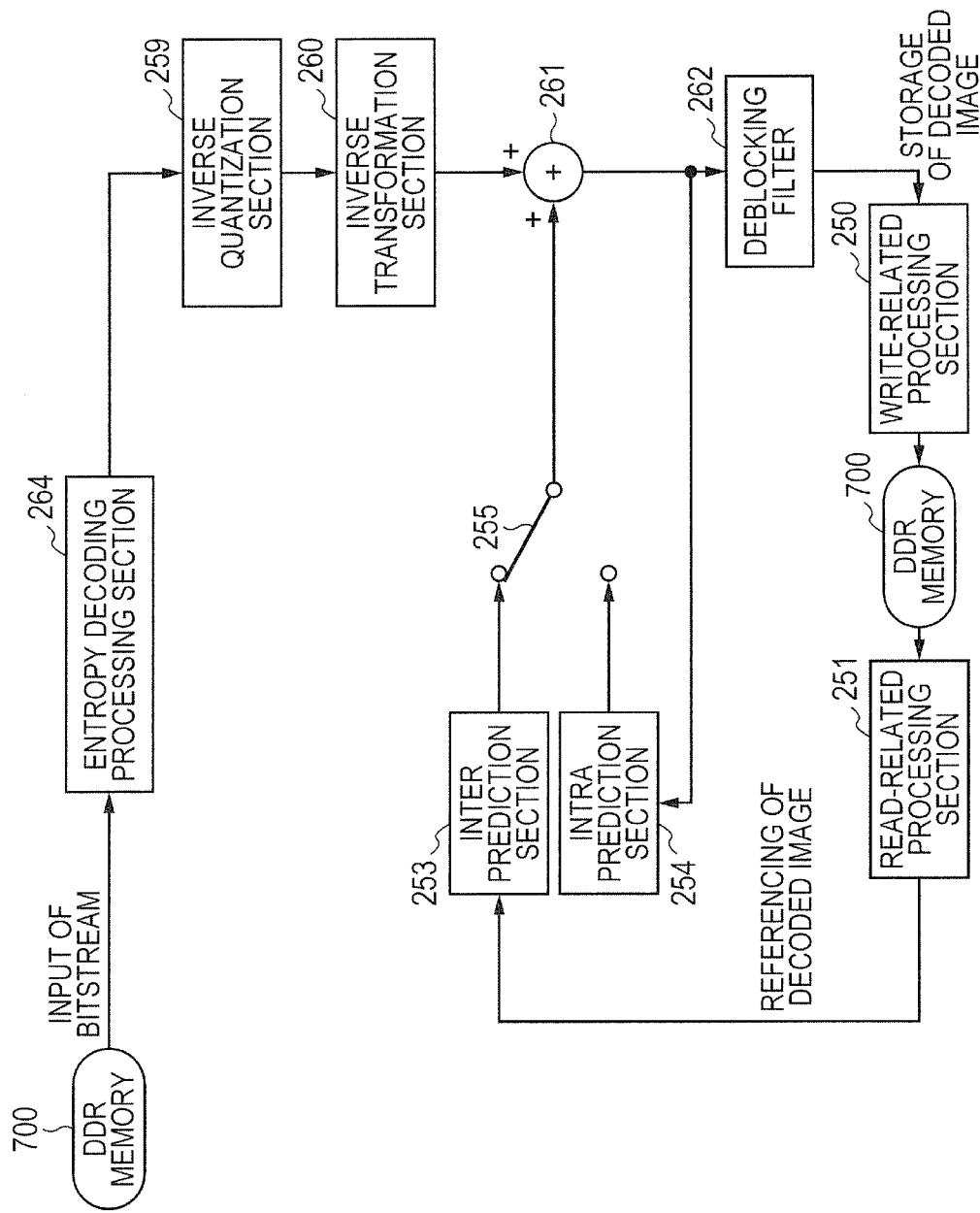
FIG. 9 is a block diagram illustrating an exemplary configuration of the video codec system in a case where the first embodiment is applied to a video decoding process.

An exemplary configuration of the video codec system 200 in a case where the first embodiment is applied to a video decoding process will now be described. FIG. 9 is a block diagram illustrating the exemplary configuration of the video codec system 200 in a case where the first embodiment is applied to the video decoding process. As illustrated in FIG. 9, the video decoding process can be implemented by adding an entropy decoding processing section 264 to the inverse quantization section 259, the inverse transformation section 260, the adder 261, the inter prediction section 253, the intra prediction section 254, the selection section 255, the deblocking filter 262, the write-related processing section 250, and the read-related processing section 251, which are depicted in FIG. 8. The entropy decoding processing section 264, which is an element belonging to the video codec core 210 depicted in FIG. 5, performs an entropy decoding process on a bitstream read from the DDR memory 700. The bitstream in the DDR memory 700 is read by performing a non-image data read operation without involving a process by the read-related processing section 251. That is to say, the bitstream is processed by the error detection/error correction section 502 depicted in FIG. 5, and then inputted to the read I/F 212.

Data outputted from the entropy decoding processing section 264 is subjected to the same process as for local decoded image generation in the aforementioned video encoding process by using the inverse quantization section 259, the inverse transformation section 260, the adder 261, the inter prediction section 253, the intra prediction section 254, the selection section 255, and the deblocking filter 262. In this instance, a decoded image outputted from the deblocking filter 262 is outputted from the write I/F 211 depicted in FIG. 5, and then inputted to the write-related processing section 250.

In the write-related processing section 250, processing is performed by the aforementioned lossless compression section 220, error control code generation section 221, data length determination section 222, and binding section 223. Thus, the image data and its error control code are stored in the DDR memory 700. The image data stored in the DDR memory 700 is referenced to decode a different image. In this instance, the image data is read through the read-related processing section 251. That is to say, the image data is processed by the aforementioned separation/decompression section 230 and error detection/error correction section 240, and then inputted to the read I/F 212.

The first embodiment has been described above. In the data processing device 10 according to the first embodiment, storage-targeted data and its error control code are joined together and written into the DDR memory 700 as single data. This inhibits transfer bandwidth from being increased by the transfer of an error control code to the DDR memory 700. When the amount of transfer in the data processing device 10 according to the first embodiment is studied in the same manner as for the amount of transfer in the data processing device 9 according to the comparative example, the relative value V is as indicated in Table 2 below.

Here, the relative value V is expressed by Equation (2) below. Equation (2) differs from Equation (1) in that the amount of transfer of an error control code for image data is not 64 bytes, but is 32 bytes, which is the code length of the error control code.

Relative value $V=(85\%\times(256\times R+32)+15\%\times(256+32))/(85\%\times 256+15\%\times 256)$ (2)

TABLE 2

| Compression ratio R | 0.1 | 0.2 | 0.3 | 0.4 | 0.5 | 0.6 | 0.7 | 0.8 | 0.9 | 1.0 |
|---|---|---|---|---|---|---|---|---|---|---|
| Relative value V | 36% | 45% | 53% | 62% | 70% | 79% | 87% | 96% | 104% | 113% |

A comparison between the relative value V in the data processing device 9 according to the comparative example and the relative value V in the data processing device 10 according to the first embodiment indicates that bandwidth can be reduced by approximately 10 to 11%.

Second Embodiment

In the first embodiment, the error control code generation section 221 generates a predetermined error control code for image data having a predetermined data length (256 bytes). In the first embodiment, therefore, the error control code generation section 221 generates one error control code, for example, for 8-byte data. In this instance, a 32-byte error control code is generated for 256-byte image data. In order to permit the binding section 223 to perform a binding operation, it is required that the total data length of binding-targeted data and an error control code be equivalent to predetermined data (256 bytes). The length of data compressed by the lossless compression section 220 varies with compression-targeted data. Thus, in order to allow the binding section 223 to perform a binding operation on any image data, it is preferable that the code length of the error control code to be generated be small. Consequently, the error control code generation section 221 in the second embodiment generates one error control code for 256-byte data in order to reduce the code length of the error control code to be generated. Accordingly, as is the case with the error control code generation section 221, the error detection/error correction section 240 also generates one error control code for 256-byte data at the time of detection or correction processing.

In marked contrast to bitstream data and program data executed by the CPU 100, image data used for codec processing is not fatally affected even if an error occurs in the DDR memory 700. The reason is that an image portion in an extremely small area is disordered in the event of an error. Therefore, even if an error control code having a low detection capability or a low correction capability is applied to image data to be inputted to the error control code generation section 221, the image data is not fatally affected. Consequently, the present embodiment does not generate a 1-byte error control code for 8 bytes, but generates one error control code for 256 bytes. In a case, for example, where the probability of 1-bit data inversion is sufficiently low (e.g., the probability of such inversion is on the order of $10^{-4}$), no error correction is needed, and the tolerable probability of error detection failure is approximately 10%, a 4-bit CRC can be used as an error detection code to be added to 256-byte data.

As described above, the error control code generation section 221 in the present embodiment, for example, generates an error control code (error detection code) having a code length of 4 bits. When 256-byte image data is losslessly compressed, compression of at least approximately 4 bits can be achieved irrespective of the image data. Therefore, if a 4-bit error control code is generated, a binding operation can always be performed by the binding section 223. Consequently, an increase in the amount of transfer due to the transfer of an error control code for image data can be substantially reduced to approximately 0 (zero).

When the amount of transfer in a case where a 4-bit error control code is used is studied, the relative value V is as indicated in Table 3 below.

Here, the relative value V is expressed by Equation (3) below. Equation (3) differs from Equation (1) in that the amount of transfer of an error control code for image data is not 64 bytes, but is 4 bits (=0.5 bytes), which is the code length of the error control code.

Relative value $V=(85\%\times(256\times R+0.5)+15\%\times(256+32))/(85\%\times 256+15\%\times 256)$  (3)

TABLE 3

| Compression ratio R | 0.1 | 0.2 | 0.3 | 0.4 | 0.5 | 0.6 | 0.7 | 0.8 | 0.9 | 1.0 |
|---|---|---|---|---|---|---|---|---|---|---|
| Relative value V | 26% | 34% | 43% | 51% | 60% | 68% | 77% | 85% | 94% | 102% |

A comparison between the relative value V in the data processing device 9 according to the comparative example and the relative value V in the data processing device 10 according to the second embodiment indicates that bandwidth can be reduced by approximately 21%.

Third Embodiment

Figure 10:
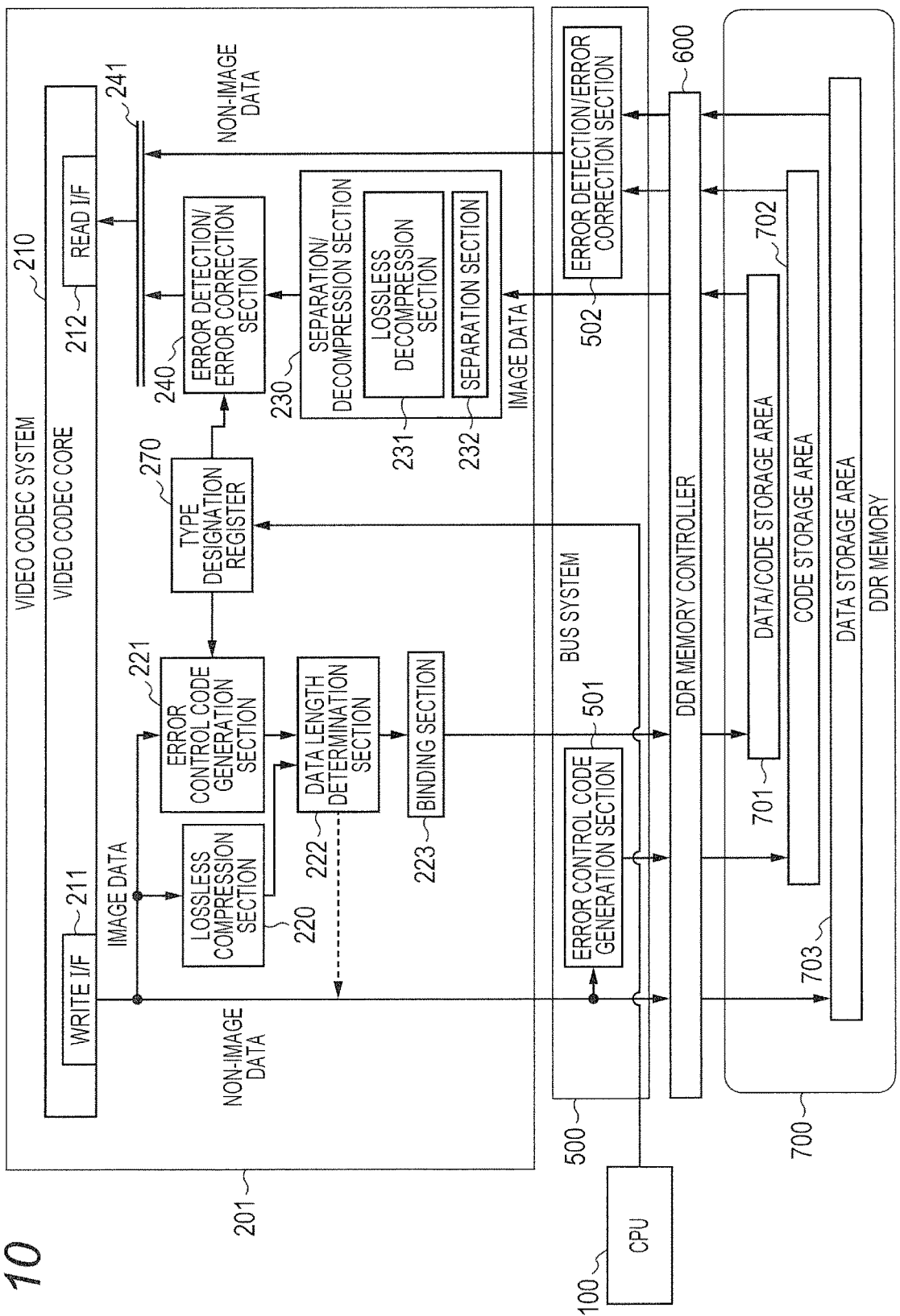
FIG. 10 is a block diagram illustrating a more detailed configuration of the data processing device according to a third embodiment of the present invention with particular attention paid to the video codec system.

A third embodiment of the present invention differs from the foregoing embodiments in that the type of the error control code to be generated by the error control code generation section 221 is changed to a picture type for image data. A configuration according to the third embodiment differs from the configurations according to the foregoing embodiments in that the video codec system 200 is replaced by a video codec system 201. FIG. 10 is a block diagram illustrating a more detailed configuration of the data processing device 10 according to the third embodiment with particular attention paid to the video codec system 201. The video codec system 201 differs from the video codec system 200 depicted in FIG. 5 in that a type designation register 270 is added. The third embodiment will now be described mainly by explaining about differences from the foregoing embodiments. It should be noted, however, that elements and operations similar to those in the foregoing embodiments will not be redundantly described.

The type designation register 270 stores a value indicative of whether image data to be stored in the DDR memory 700 or image data to be read from the DDR memory 700 is a picture that is to be referenced by a different picture. More specifically, when transfer-targeted image data is to be referenced by a different picture for inter prediction within a codec process of the video codec core 210, a first value is set in the type designation register 270. Meanwhile, when transfer-targeted image data is a picture that is not to be referenced by a different picture, a second value is set in the type designation register 270. In the third embodiment, the operation of the video codec system 201 is controlled by allowing the CPU 100 to execute a program for controlling the codec process. Thus, the CPU 100 sets the type designation register 270. More specifically, the CPU 100 sets the type designation register 270 to a value indicative of the type of picture to be processed by the video codec core 210. It should be noted that the type designation register 270 may be set in an alternative manner.

The error control code generation section 221 generates an error control code based on the value set in the type designation register 270. More specifically, if the first value is set in the type designation register 270, the error control code generation section 221 generates a primary-type error control code. If, the second value is set in the type designation register 270, the error control code generation section 221 generates a secondary-type error control code. The primary-type error control code has a greater code length than the secondary-type error control code (the primary-type error control code has a higher detection capability or correction capability than the secondary-type error control code). For example, the primary-type error control code is a 32-bit CRC, and the secondary-type error control code is a 4-bit CRC.

Similarly, the error detection/error correction section 240 also generates an error control code based on the value set in the type designation register 270, and performs a detection or correction process.

As described above, the error control code to be generated can be changed by the value set in the type designation register 270. In this respect, the type designation register 270 may be defined as a register in which a value for designating a type of error control code is set. The CPU 100, which sets a value in the type designation register 270, is referred to also as the type designation section.

As described above, the CPU 100 designates a type of error control code depending on whether image data to be stored in the DDR memory 700 or image data to be read from the DDR memory 700 is to be referenced by a different picture for inter prediction purposes. Particularly, when the image data to be stored in the DDR memory 700 or the image data to be read from the DDR memory 700 is to be referenced by a different picture, the CPU 100 designates the primary-type error control code. Meanwhile, when the image data is not to be referenced by a different picture, the CPU 100 designates the secondary-type error control code.

The video codec system 201 having the above-described configuration is capable of changing the error detection or error correction capability for video codec processing in accordance with a picture type.

In the case of an I picture or other picture that is to be referenced by a decoding process for a different picture, data garbled by an error is taken over by the different picture that references the picture having the garbled data. In this case, therefore, an error control code having a high detection or high correction capability (having a great code length) (e.g., a 32-bit CRC) is designated. Meanwhile, even when a picture to be not referenced includes garbled data, the influence of the garbled data is limited to the picture. This makes it possible to give priority to reducing the amount of transfer. Consequently, an error control code having a low detection or low correction capability (having a small code length) (e.g., 4-bit CRC) is designated.

Figure 11:
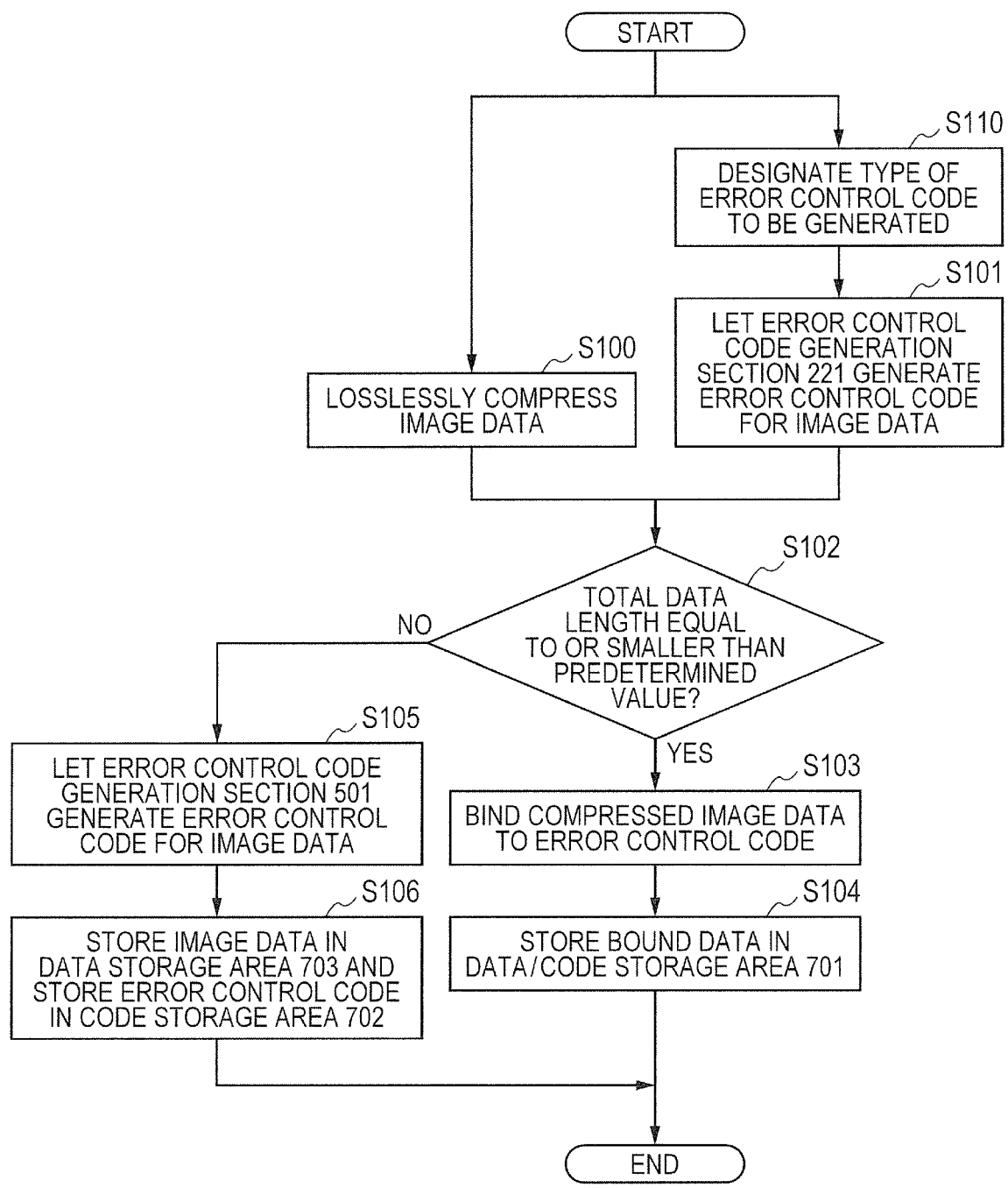
FIG. 11 is a flowchart illustrating exemplary operations that are performed by the data processing device according to the third embodiment in order to write image data outputted from the video codec core into the DDR memory.

Data write and data read operations in the data processing device 10 according to the third embodiment will now be described. FIG. 11 is a flowchart illustrating exemplary operations that are performed by the data processing device 10 according to the third embodiment in order to write image data outputted from the video codec core 21 into the DDR memory 700. The flowchart of FIG. 11 differs from the flowchart of FIG. 6 in that step 110 is added before step 101.

In step 110 (S110), the error control code generation section 221 designates a type of error control code to be generated. More specifically, the error control code generation section 221 references the value set in the type designation register 270 by the CPU 100 in order to designate the type of error control code to be generated. Upon completion of step 110, processing proceeds to step 101. In step 101, the error control code designated in step 110 is generated. Subsequently, the same steps are performed as illustrated in the flowchart of FIG. 6.

Figure 12:
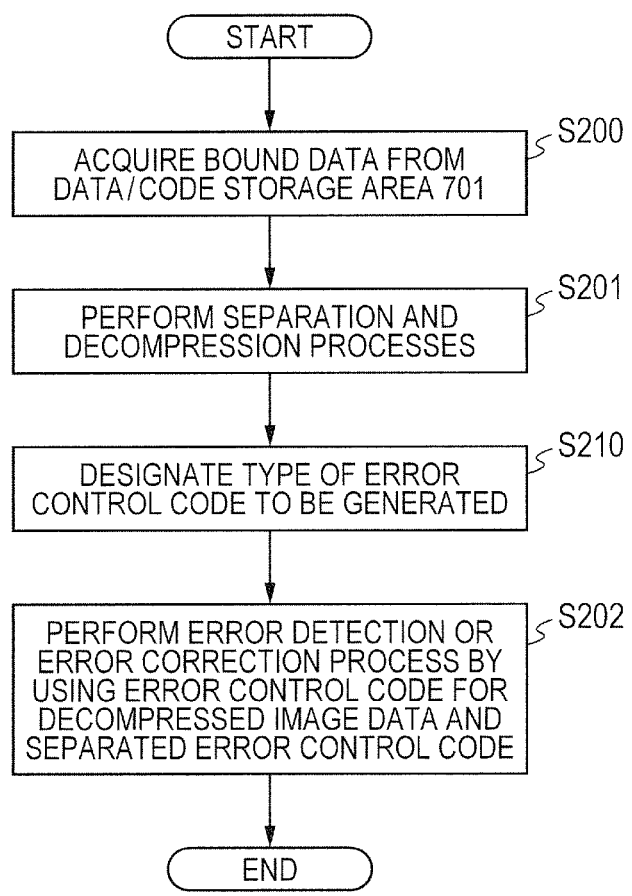
FIG. 12 is a flowchart illustrating exemplary operations that are performed by the data processing device according to the third embodiment in order to read data stored in the data/code storage area.

Operations performed to read data stored in the data/code storage area 701 will now be described. FIG. 12 is a flowchart illustrating exemplary operations that are performed by the data processing device 10 according to the third embodiment in order to read data stored in the data/code storage area 701. The flowchart of FIG. 12 differs from the flowchart of FIG. 7 in that step 210 is added between steps 201 and 202.

Upon completion of step 201, processing proceeds to step 210. In step 210 (S210), the error control code generation section 221 designates a type of error control code to be generated. Subsequently, in step 202, the error detection/error correction section 240 generates the type of error control code that is designated in step 210 in accordance with decompressed data, and performs an error detection or error correction process by using the generated error control code and a separated error control code.

The third embodiment has been described. Based on the picture type of image data, the third embodiment is able to change the type of error control code to be generated. Consequently, the third embodiment is capable of properly adjusting error tolerance and the amount of transfer.

Fourth Embodiment

In the third embodiment, which has been described above, the type of error control code can be changed in accordance with the type of image data. However, the type of error control code may also be changed in accordance with usage of storage-targeted data. More specifically, the CPU 100 may designate the type of error control code in accordance with usage of storage-targeted data. That is to say, the type of error control code may be designated, as described in conjunction with the third embodiment, depending on whether storage-targeted image data is to be used for the prediction of a different picture. However, the type of error control code may be designated in accordance with a different use. When the type of error control code is changed in accordance with usage of data, error tolerance and the amount of transfer can be properly adjusted in accordance with usage of data. For example, the CPU 100 may designate the type of error control code in accordance with the importance of a process that uses storage-targeted data. That is to say, the type of error control code may be designated in accordance with the degree of importance of a process in which the storage-targeted data is used. For example, the type of error control code may be changed in accordance with error tolerance required by each application program.

A fourth embodiment of the present invention will now be described by explaining about a configuration where the type of error control code is changed in accordance with the importance of a process. In a system where inputs are received from two or more cameras, such as a system on a chip (SoC) for an advanced driver assistance system (ADAS), images captured by the cameras may differ in importance. For example, when a vehicle is backing up, for instance, for parking purposes, an image captured by a vehicle-mounted rear-view camera appears on a display to present it to a driver of the vehicle. In this instance, the image captured by the rear-view camera is more important than images captured by the other vehicle-mounted cameras. That is to say, a video process for the rear-view camera is more important (higher in priority) than video processes for the other vehicle-mounted cameras. Therefore, it is preferable that a process on a highly important video (a video presented to the driver) be executed with priority given to error tolerance. Meanwhile, it is preferable that a process on the other types of video be executed with priority given to the reduction of the amount of transfer.

Figure 13:
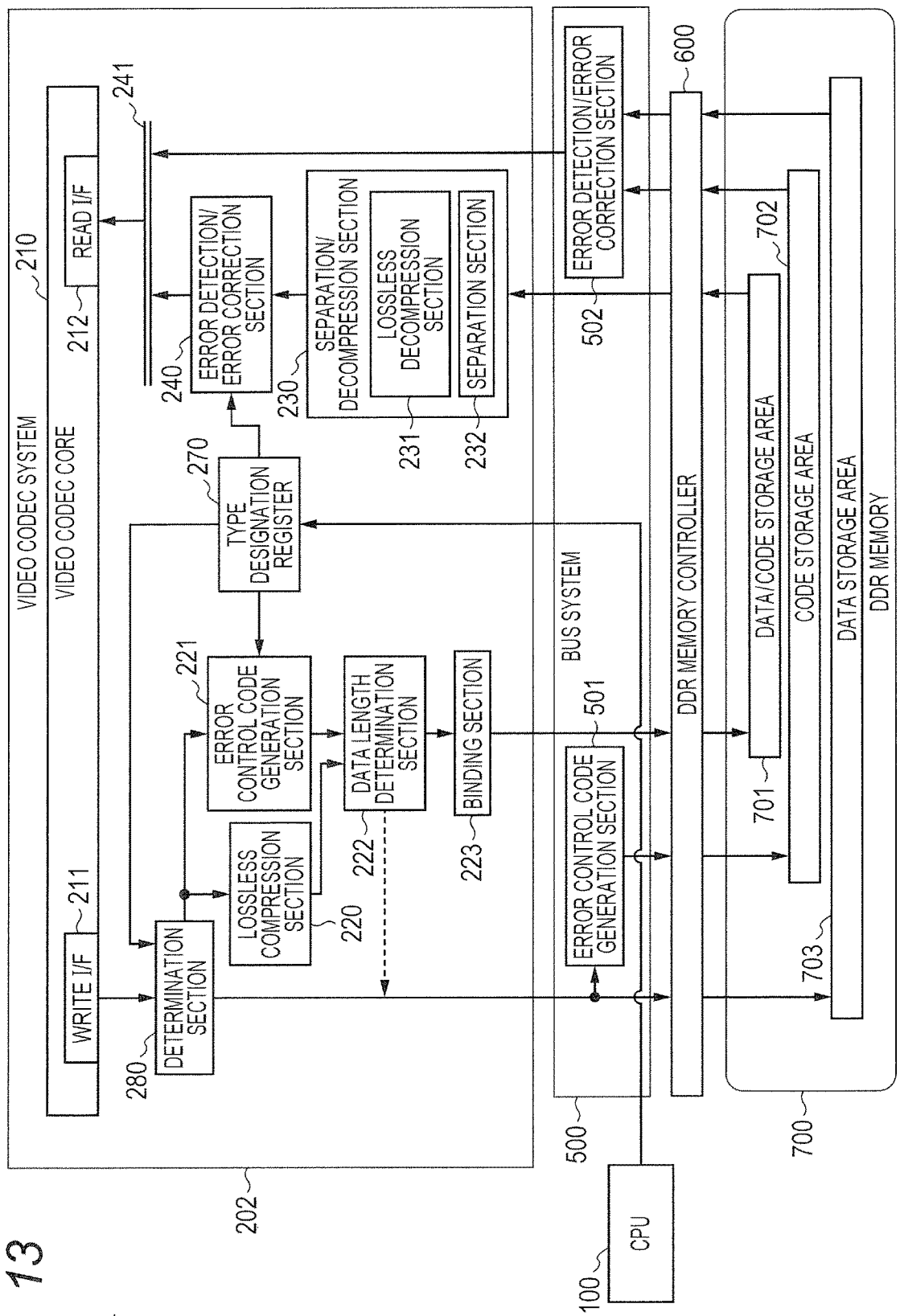
FIG. 13 is a block diagram illustrating a more detailed configuration of the data processing device according to a fourth embodiment of the present invention with particular attention paid to the video codec system.

FIG. 13 is a block diagram illustrating a more detailed configuration of the data processing device 10 according to the fourth embodiment with particular attention paid to a video codec system 202. The video codec system 202 differs from the video codec system 201 depicted in FIG. 10 in that a determination section 280 is added. The fourth embodiment will now be described mainly by explaining about differences from the foregoing embodiments. It should be noted, however, that elements and operations similar to those in the foregoing embodiments will not be redundantly described.

As is the case with the third embodiment, the type designation register 270 is used to set a value that designates the type of error control code. In the fourth embodiment, however, for example, the CPU 100 sets a value indicative of the importance of a process that uses storage-targeted data. Therefore, it can be said that the type designation register 270 stores a value indicative of importance of a process that uses data to be stored in the DDR memory 700 or data to be read from the DDR memory 700.

The determination section 280 determines whether an error control code for storage-targeted data is to be generated by the error control code generation section 221 or the error control code generation section 501. In the present embodiment, the error control code generation section 501 generates an error control code having a higher detection capability or a higher correction capability than error control codes that can be generated by the error control code generation section 221. Therefore, when data to be used in a process having the highest importance is to be stored, it is preferable that the error control code generation section 501 generate an error control code. Accordingly, the determination section 280 references the value set in the type designation register 270 in order to determine whether an error control code for storage-targeted data is to be generated by the error control code generation section 221 or the error control code generation section 501. If it is determined that an error control code is to be generated by the error control code generation section 221, the present embodiment allows the error control code generation section 221 and the lossless compression section 220 to process storage-targeted data. If, by contrast, it is determined that the error control code is to be generated by the error control code generation section 501, the present embodiment stores the storage-targeted data in the DDR memory 700 without compressing it.

If it is determined that an error control code is to be generated by the error control code generation section 221, the error control code generation section 221 generates a type of error control code that is designated by a value set in the type designation register 270. If the error control code generation section 221 is able to generate only one type of error control code, the error control code generation section 221 may generate an error control code without referencing the type designation register 270.

Storage-targeted data may be video data that is captured by any one of two or more vehicle-mounted cameras. The CPU 100 (type designation section) may designate a type of error control code depending on which camera has captured video data serving as the storage-targeted data. That is to say, a value may be set in the type designation register 270 depending on whether or not the storage-targeted data is image data used in highly important video codec processing.

This makes it possible to ensure error tolerance in a highly important video process and reduce the amount of memory access gained to perform a less-important video process.

As described above, the CPU 100 (type designation section) designates the primary-type error control code when a process has primary importance, and designates the secondary-type error control code when the process has secondary importance, which is lower than the primary importance. The primary-type error control code has a greater code length than the secondary-type error control code (has a higher detection capability or a higher correction capability than the secondary-type error control code). A type of error control code that is designated by the CPU 100 (type designation section) is generated by the error control code generation section 221 or the error control code generation section 501.

Figure 14:
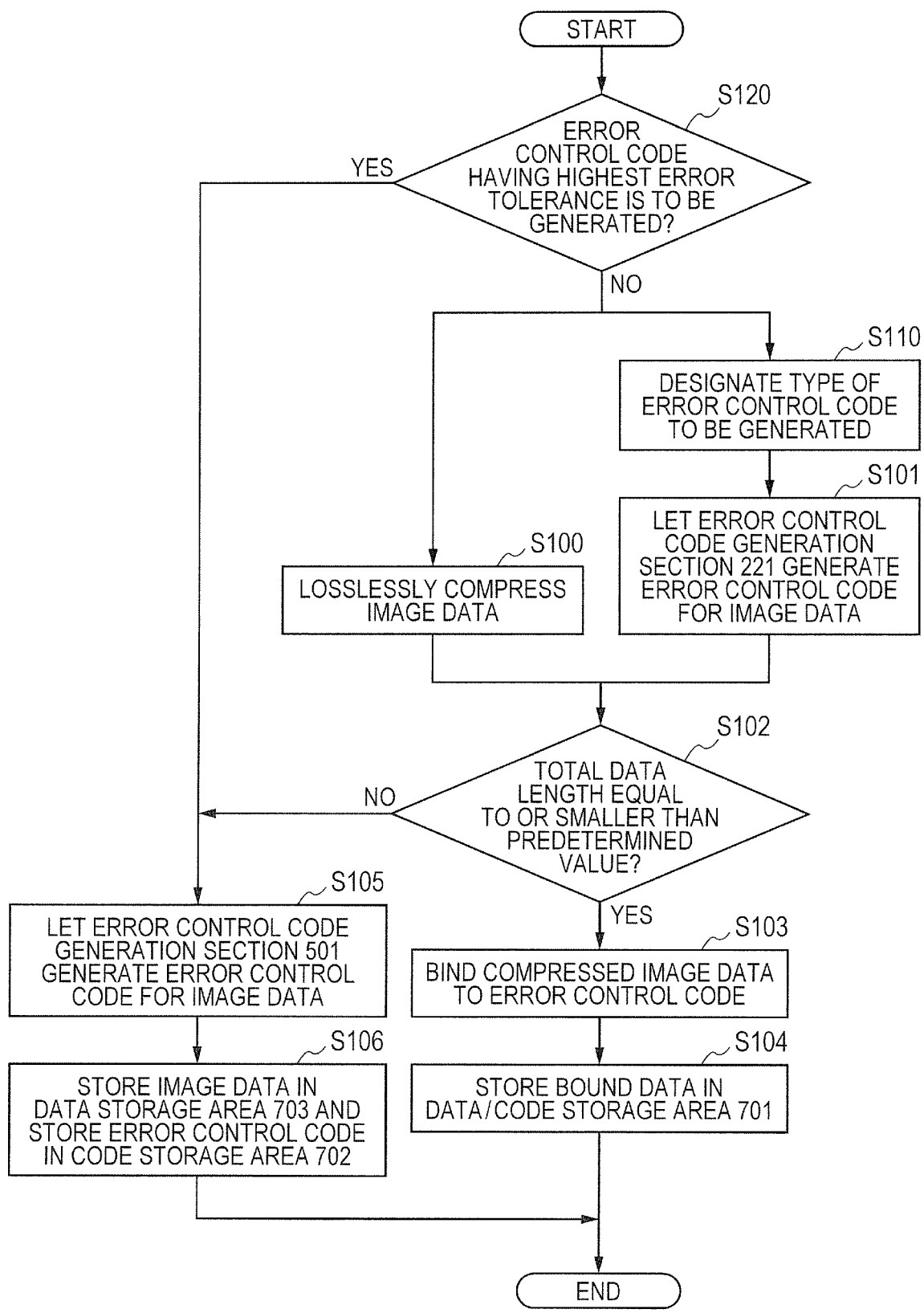
FIG. 14 is a flowchart illustrating exemplary operations that are performed by the data processing device according to the fourth embodiment in order to write image data outputted from the video codec core into the DDR memory.

FIG. 14 is a flowchart illustrating exemplary operations that are performed by the data processing device 10 according to the fourth embodiment in order to write image data outputted from the video codec core 210 into the DDR memory 700. The flowchart of FIG. 14 differs from the flowchart of FIG. 11 in that step 120 is added before steps 100 and 110.

First of all, in step 120 (S120), a check is performed to determine whether or not to generate an error control code having the highest error tolerance. More specifically, based on a value set in the type designation register 270, the determination section 280 determines whether the error control code generation section 501 generates an error control code. If it is determined that the error control code is to be generated by the error control code generation section 501, processing proceeds to step 105. The data processing device 10 then generates a generatable error control code having the highest error tolerance. Processing performed in steps 105 and beyond is the same as depicted in the flowchart of FIG. 11.

If, by contrast, it is determined that the error control code need not be generated by the error control code generation section 501, processing proceeds to steps 100 and 110. Processing performed in steps 100, 110, and beyond is the same as depicted in the flowchart of FIG. 11. Generated in step 110 is an error control code that is one of two or more error control codes having lower error tolerance than the error control code to be generated by the error control code generation section 501 and is designated by a value set in the type designation register 270.

Operations performed to read data stored in the data/code storage area 701 are the same as depicted in the flowchart of FIG. 12 and will not be redundantly described.

Based on the importance of a process, the fourth embodiment is capable of changing the type of error control code to be generated. Consequently, the fourth embodiment is able to properly adjust error tolerance and the amount of transfer in accordance with the importance of the process.

While the present invention contemplated by its inventors has been described in detail in terms of particular embodiments, the present invention is not limited to the foregoing embodiments. It will be obvious to those skilled in the art that various modifications can be made without departing from the spirit and scope of the present invention.

For example, the third embodiment is configured so that the error control code generation section 501 is able to generate an error control code having higher error tolerance than the error control code generation section 221. Thus, the determination section 280 in the third embodiment determines which error control code generation section is to be used. However, the determination section 280 need not be provided if only the error control code generation section 221 is allowed to change the type of error control code to be generated.

Further, the foregoing embodiments are configured so that the video codec system 200 and the bus system 500 both generate an error control code. Alternatively, however, either one of the systems 200, 500 may be configured to generate an error control code. Further, an alternative is to omit an element for generating an error control code that is not to be bound by the binding section 223 (i.e., the error control code generation section 501). Furthermore, the foregoing embodiments have been described in relation to image data that is to be stored in the memory at the time of codec processing. However, data to be stored in the memory at the time of certain processing including non-image processing may be bound by the binding section 223.

The storage destination of storage-targeted data is not limited to the DDR memory. Alternatively, the storage-targeted data may be stored also in a different memory having a certain configuration. Further, when the storage destination of storage-targeted data is the DDR memory, a DDR memory compliant with a certain DDR standard may be used.

Furthermore, the foregoing embodiments have been described on the assumption that the elements depicted in the drawings are implemented by hardware circuitry. However, some or all of the elements may alternatively be implemented by allowing a processor to execute a program. That is to say, in the data processing device configured as a computer, processing of the elements depicted in the drawings may be implemented by allowing a processor to execute a program. In this instance, the processor may be, for example, the CPU 100 or a different CPU disposed in a subsystem.

Moreover, the above-mentioned program may be stored on various types of non-transitory computer-readable media and supplied to a computer. The non-transitory computer-readable media include various types of tangible storage media. Examples of the non-transitory computer-readable media include a magnetic recording medium (e.g., a flexible disk, a magnetic tape, or a hard disk drive), a magneto-optical recording medium (e.g., a magneto-optical disk), a CD-ROM (compact disc read-only memory), a CD-R, a CD-R/W, a semiconductor memory (e.g., a mask ROM, a PROM (programmable ROM), an EPROM (erasable PROM), a flash ROM, or a RAM (random-access memory)). Further, the program may be supplied to the computer by using various types of transitory computer-readable media. Examples of the transitory computer-readable media include electrical signals, optical signals, and electromagnetic waves. The transitory computer-readable media are able to supply the program to the computer through a wired communication channel, such as an electrical wire or an optical fiber, or through a wireless communication channel.

What is claimed is:
1. A data processing method comprising:
performing a predetermined video codec process of generating a bitstream from image data, the image data being a first data, at a codec section;
receiving the first data in units of a predetermined data length from the codec section and generating second data by performing a predetermined compression process on the first data, at a data compression section;
receiving the first data from the codec section and generating a first error control code for the second data, at a first code generation section;

receiving the second data and the first error control code and determining whether a sum of a data length of the second data and a code length of the first error control code is not greater than the predetermined data length, at a determination section;

generating third data by binding the second data generated by the data compression section to the first error control code generated by the first code generation section when the determination section determines that the sum is not greater than the predetermined data length, at a binding section; and transferring the third data generated by the binding section from a transfer section to a memory, wherein the transfer section includes a second code generation section that receives the bitstream and generates a second error control code for the bitstream, wherein the transfer section transfers both the bitstream and the second error control code to the memory, and wherein when the determination section determines that the sum is greater than the predetermined data length, the second code generation section generates a third error control code for the first data, and the transfer section transfers the first data and the third error control code to the memory without allowing the binding section to perform a binding operation.

2. The data processing method according to claim 1, further comprising:

designating a type of the first error control code in accordance with usage of the first data at a type designation section, wherein the first code generation section generates the type of the first error control code that is designated by the type designation section.

3. The data processing method according to claim 2, wherein the type designation section designates the type of the first error control code depending on whether the first data comprises a picture that is to be referenced by a different picture for inter prediction purposes.

4. The data processing method according to claim 3, wherein, when the first data comprises the picture that is to be referenced by the different picture, the type designation section designates a primary-type error control code, wherein, when the first data comprises a picture that is not to be referenced by the different picture, the type designation section designates a secondary-type error control code, and wherein the primary-type error control code has a greater code length than the secondary-type error control code.

5. The data processing method according to claim 2, wherein the type designation section designates the type of the first error control code in accordance with importance of a process that uses the first data.

6. The data processing method according to claim 5, wherein, when the process is of primary importance, the type designation section designates a primary-type error control code, wherein, when the process is of secondary importance, the type designation section designates a secondary-type error control code, the secondary importance being lower than the primary importance, and wherein the primary-type error control code has a greater code length than the secondary-type error control code.

7. The data processing method according to claim 1, wherein the memory includes a first storage area for storing the third data, a second storage area for storing the second error control code and a third storage area for storing the first data and the bitstream.

8. The data processing method according to claim 7, wherein the predetermined compression process provides lossless compression, and wherein the first error control code has a code length of 4 bits.

9. The data processing method according to claim 7, further comprising:

performing a decompression process for the predetermined compression process by using the third data acquired from the memory at a data decompression section; and detecting or correcting an error by using the first error control code included in the third data acquired from the memory at a detection section.

10. The data processing method according to claim 7, wherein the first data is used to generate a prediction image during the predetermined video codec process.

* * * * *